United States Patent [19]

Kinoshita

[11] 4,204,277
[45] May 20, 1980

[54] DYNAMIC READ-WRITE RANDOM ACCESS MEMORY

[75] Inventor: Hiroyuki Kinoshita, Tokyo, Japan

[73] Assignee: Tokyo Shibaura Electric Co., Ltd., Kawasaki, Japan

[21] Appl. No.: 876,947

[22] Filed: Feb. 10, 1978

[30] Foreign Application Priority Data

Feb. 10, 1977 [JP] Japan .................................. 52-13899

[51] Int. Cl.² ............................................ G11C 11/40
[52] U.S. Cl. .................................. 365/203; 365/182; 307/238
[58] Field of Search ............... 365/174, 182, 184, 203, 365/206; 307/238, 279

[56] References Cited

U.S. PATENT DOCUMENTS

| | | | |
|---|---|---|---|
| 3,387,286 | 6/1968 | Dennard | 365/174 |
| 3,765,003 | 10/1973 | Paivinen et al. | 307/279 |
| 3,774,176 | 11/1973 | Stein et al. | 307/238 |
| 3,778,783 | 12/1973 | Proebsting et al. | 307/279 |
| 3,778,784 | 12/1973 | Karp et al. | 365/189 |
| 3,969,706 | 7/1976 | Proebsting et al. | 365/189 |

FOREIGN PATENT DOCUMENTS

| | | |
|---|---|---|
| 48-38946 | 9/1972 | Japan . |
| 51-74535 | 6/1976 | Japan . |
| 51-122343 | 10/1976 | Japan . |

*Primary Examiner*—Terrell W. Fears
*Attorney, Agent, or Firm*—Finnegan, Henderson, Farabow & Garrett

[57] ABSTRACT

A dynamic read-write random access memory utilizing metal oxide semiconductor field effect transistors (abbreviated as "MOS FETs") which comprises a plurality of data lines which are charged with electric energy (electric charge) or from which electric energy is discharged according to the logic operation, and wherein the respective data lines are connected to memory cells each formed of one transistor and one capacitor, precharge transistors and enhancement type MOS transistors for prevention of an erroneous behavior of the random access memory; and the gates of the enhancement type MOS transistors for prevention of the erroneous behavior are impressed with such level of voltage as approximates the threshold voltage of the transistors in order to prevent the deviation $\Delta V$ of the potential of the data lines from the referential power source potential $V_{SS}$ to the negative side.

13 Claims, 8 Drawing Figures

DYNAMIC READ-WRITE RANDOM ACCESS MEMORY

BACKGROUND OF THE INVENTION (1) Field of the Invention

This invention relates to a dynamic read-write random access memory, and more particularly to a dynamic read-write random access memory fabricated with conductor-insulator-semiconductor FETs in integrated circuit form which is so improved as to minimize the dissipation of electric energy stored in a nonselected memory cell.

(2) Description of the Prior Art

Various electric circuits such as a processor and a memory have come to be integrated on a semiconductor due to the prominent development of semiconductor techniques.

A dynamic read-write random access memory (herein after abbreviated as "a dynamic RAM"), is a kind of semiconductor memory allowing not only the reading but also the writing of data. It is adapted to have a large capacity because a memory cell for holding data (stored electric charge) is formed of a smaller number of transistors.

With the dynamic RAM, data is stored in the capacitor (or parasitic capacitor) of an MOS FET circuit. Data thus stored gradually dissipates with time. To avoid such a data dissipation, the dynamic RAM is provided with a refresh circuit (or sense amplifier) to refresh the data in the capacitor before the data is fully lost. The interval at which data is to be refreshed by the refresh circuit is largely affected by the period in which data is capable of being held in the capacitor.

As is well known, a dynamic RAM of the above-mentioned type usually comprises a plurality of memory cells arranged in the matrix form; a plurality of address lines (rows) enabling data to be read out of memory cells belonging to a row selected or enabling data to be written therein; a plurality of data lines (columns) enabling data to be read out of a selected memory cell or to be written therein; data line-selecting transistors connected between the data lines on one hand and the input and output circuits on the other; sense amplifiers (refresh circuits); and other circuits.

This is well understood from the U.S. Pat. Nos. 3,765,003; 3,774,176; 3,969,706; 3,778,783 and 3,778,784 and the Japanese patent disclosures Nos. 51-74,535; 51-137,339; 51-122,343 and 46-3006.

When data is read out of a selected memory cell through a data line and an output circuit, or when data is written in a selected memory cell through an input circuit and a data line, a data line-selecting transistor is first changed from the OFF state to the ON state and then from the ON state to the OFF state.

Where, with the prior art dynamic RAM, data of "0" (corresponding to the referential voltage $V_{SS}$) was read out of a memory cell, the potential of a selected date line sometimes presented a deviation $\Delta V$ from the referential power source potential $V_{SS}$ toward the negative side, causing said dynamic RAM to make an erroneous behavior. Namely, since the potential of the data line indicated a deviation $\Delta V$ from the referential power source potential $V_{SS}$ toward the negative side, the gate of a MOS transistor constituting a nonselected memory cell storing data of "1" (corresponding to a positive potential $V_{DD}$) indicated a higher potential than the terminal (source) of the transistor connected to the data line, and the MOS transistor which indicated a weak or strong inversion region was rendered conductive. As a result, the data of "1" stored in the nonselected memory cell dissipated in a far shorter time than that defined by the leak current of a PN junction. Eventually, the dynamic RAM erroneously behaved. Current running through the MOS transistor sometimes amounted to $10^2$ to $10^7$ times the leak current of the PN junction.

Deviation $\Delta V$ of the potential of the data line from the referential power source potential $V_{SS}$ toward the negative side arises from the following facts:

(1) The electric energy of the data line discharged to the referential potential $V_{SS}$ is divided by a capacitance arising between the gate of the data line-selecting transistor and the data line when the data line-selecting transistor is turned off and by other parasitic capacitance accompanying the data line.

(2) When the data line is discharged, ringing arises by a combination of inductance and capacitance accompanying the data line.

The above-mentioned problem that the data line shows a deviation $\Delta V$ from the referential power source potential $V_{SS}$ toward the negative side is caused not only by the "ON-OFF" operation of the data line-selecting transistor but also by another factor such is the "ON-OFF" operation of input and output circuits and a refresh circuit (sense amplifier). This problem further occurs not only when the MOS FET is of N type but also when the MOS FET is of P type. Further, the problem occurs not only when the memory cell is of one transistor/cell type but also when the memory cell is of three transistors/cell type or four transistors/cell type.

SUMMARY OF THE INVENTION

It is accordingly an object of this invention to provide a dynamic read-write random access memory (abbreviated as "a dynamic RAM") acting under a stable condition.

Another object of the invention is to provide a dynamic RAM improved to minimize the dissipation of electric energy (charge) stored in a nonselected memory cell.

Still another object of the invention is to provide a dynamic RAM wherein, even when the potential of the data line shows a deviation $\Delta V$, data stored in a nonselected memory cell does not dissipate in a shorter time than that defined by the leak current of a PN junction.

Further object of this invention is to provide a dynamic RAM improved to suppress the loss of electric energy accumulated in the nonselected memory cell simply by adding a relatively small number of elements.

The foregoing and other objects of the invention are attained by providing a dynamic read-write access memory which comprises (a) a plurality of data lines in which electric energy is charged or from which electric energy is discharged according to the logic operation of the dynamic RAM; (b) a plurality of memory cells connected to the data lines; and (c) electric circuits so connected to the data lines as to prevent the potential of the data lines from being deviated from the potential of a referential power source in the opposite direction to that of the potential of another power source.

BRIEF DESCRIPTION OF THE DRAWING

The exact nature of this invention, as well as other objects and advantages thereof, will be readily apparent from consideration of the following specification relating to the annexed drawings, in which like reference characters designate the same or similar parts throughout the figures thereof and wherein:

FIG. 1 (a) shows a circuit diagram of a dynamic readwrite random access memory according to a typical embodiment of this invention;

FIG. 1 (b) sets forth waveforms representing the operation of the respective parts of the dynamic RAM of FIG. 1 (a);

FIG. 1 (c) indicates a preferred circuit of an error-preventing voltage generator used in the dynamic RAM of FIG. 1 (a);

FIG. 2 (a) shows a circuit of a dynamic RAM according to another embodiment of the invention;

FIG. 2 (b) illustrates waveforms denoting the operation of the respective parts of the dynamic RAM of FIG. 2 (a);

FIG. 2 (c) shows a preferred circuit designed for precharge and concurrently for prevention of the erroneous behavior of the dynamic RAM shown in FIG. 2 (a);

FIG. 3 (a) shows a circuit of a sense amplifier applicable of this invention; and FIG. 3 (b) illustrates waveforms which show the operation of the respective parts of the dynamic RAM of FIG. 1 (a) using the circuit shown in FIG. 3 (a).

DETAILED DESCRIPTION OF THE PREFERRED EMBODIMENTS

Figure 1A:
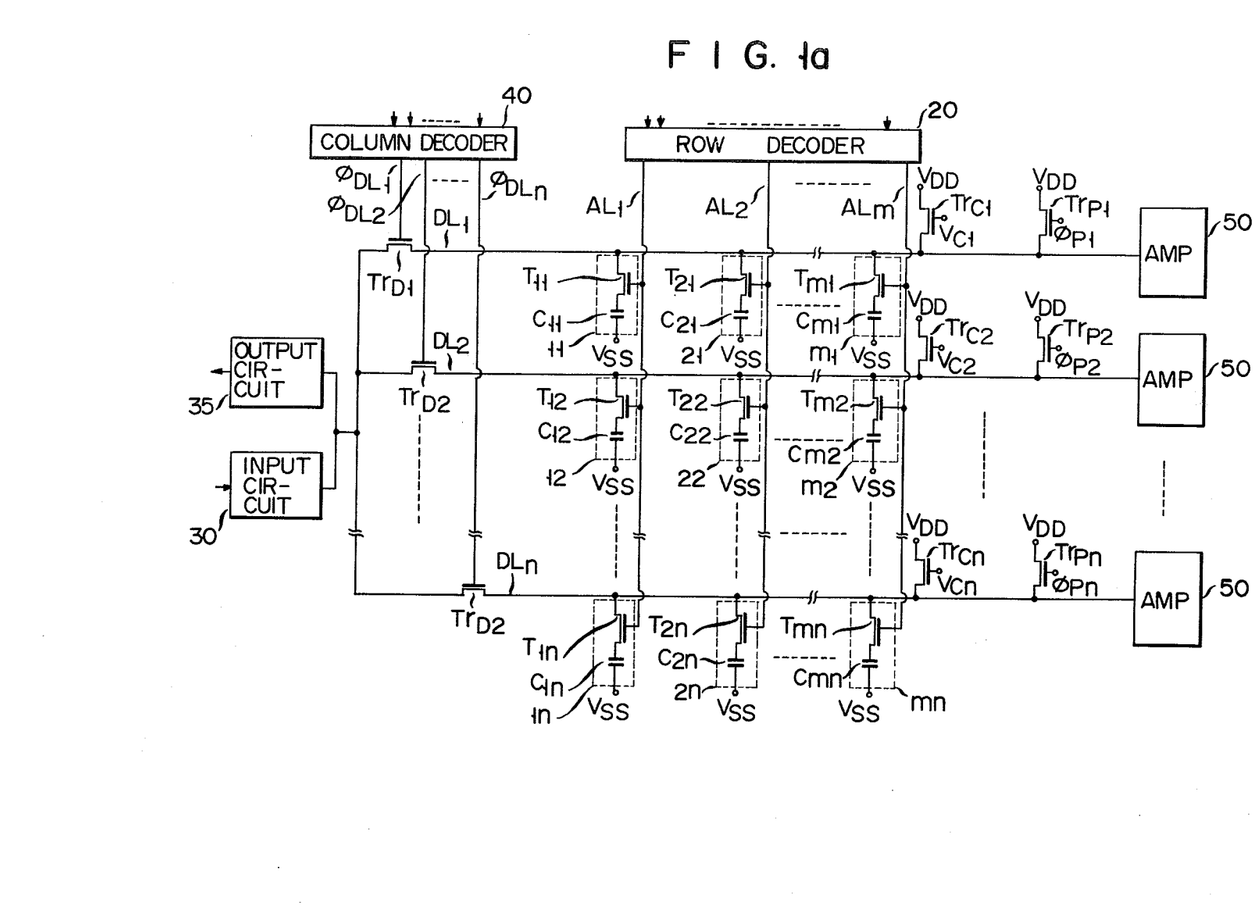

There will now be described by reference to FIG. 1 (a) a circuit of a dynamic RAM according to a typical embodiment of this invention. Memory cells MN (M=1 to m; N=1 to n) are arranged in the matrix form of m rows×n columns. Each memory cell MN consists of, for example, an MOS transistor $T_{MN}$ (M=1 to m; N=1 to n) and a capacitor $C_{MN}$ (M=1 to m; N=1 to n) connected between one end (source or drain) of the transistor $T_{MN}$ and a terminal having a referential power source voltage $V_{SS}$ (=zero level). This potential $V_{SS}$ supplied to one end of the capacitor $C_{MN}$ may be replaced by another potential $V_{DD}$.

The MOS transistor $T_{MN}$ is, for example, an enhancement type N channel MOS transistor. The capacitor stores data of "0" (corresponding to the potential $V_{SS}$) or data of "1" (corresponding to positive power source potential $V_{DD}$).

The gates of the respective MOS transistors $T_{1N}$ (N=1 to n) arranged in, for example, the first row are connected to an address line $AL_1$ disposed in the row. The respective address lines $AL_M$ (M=1 to m) are designed to take a logic level "1" or "0" according to a signal received by a row decoder 20, thereby rendering transistors $T_{MN}$ (N=1 to n) connected to the address lines $AL_M$ operative or nonoperative. The other side ends (drain or source) of the respective MOS transistors $T_{M1}$ (M=1 to m) arranged in, for example, the first column is connected to a data line $DL_1$ disposed in the column. The one side ends of the respective data lines $DL_N$ (N=1 to n) are connected to the one side ends (source or drain) of data line-selecting MOS transistors $Tr_{DN}$ (N=1 to n). These data line-selecting MOS transistors $Tr_{DN}$ are, for example, enhancement type N channel MOS transistors.

The other side ends (drain or source) of the respective data line-selecting MOS transistors $Tr_{DN}$ are connected, as shown in FIG. 1 (a), to an input circuit 30 for delivering data to be written to the respective memory cells MN and an output circuit 35 for receiving data read out of the memory cells MN. The gates of the data line-selecting MOS transistors $Tr_{DN}$ are connected to a column decoder 40 to receive a data line-selecting signal $\phi_{DLN}$ (N=1 to n). The data line-selecting MOS transistors $Tr_{DN}$ are rendered conductive or nonconductive according to a signal received by the row decoder 40, thereby controlling connection between the respective data lines $DL_N$ and the input circuit 30 or the output circuit 35.

Such decoders 20 and 40 and circuits 30 and 35 as mentioned above are shown, for example, in the U.S. Pat. No. 3,778,784. Namely, the decoders 20 and 40 in this embodiment correspond to the decode & drivers 60 and 40 in FIG. 1 of said U.S. patent, respectively. Applicable as the circuits 30 and 35 of this embodiment are the write data buffer in FIG. 12 of said U.S. patent and the data output buffer in FIG. 13 of the same, respectively.

Figure 1B:
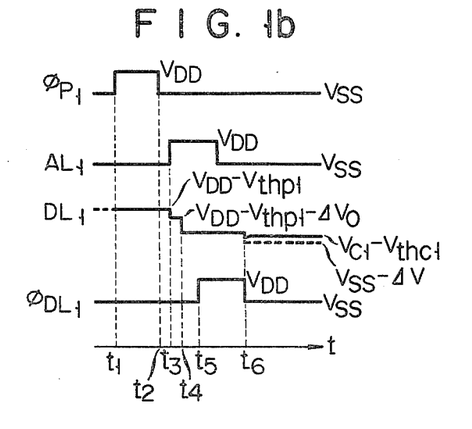

Connected between the respective data lines $DL_N$ and the terminals having a positive power source potential $V_{DD}$ are MOS transistors $Tr_{pN}$ (N=1 to n) for charging (e.g. precharging) the respective data lines $DL_N$. Those MOS transistors $Tr_{pN}$ are, for example, enhancement type N channel MOS transistors, whose gates are supplied with precharge signals $\phi_{pN}$ (N=1 to n) as shown in FIG. 1 (b).

Connected between each data line $DL_N$ and each terminal having the positive power source potential $V_{DD}$ is an a potential deviation-preventing transistor $Tr_{CN}$ (N=1 to n), i.e. a potential deviation-preventing circuit for suppressing the deviation $\Delta V$ of the potential of the data lines $DL_N$ from the referential power source voltage $V_{SS}$ toward the negative side. This arrangement is the most prominent characteristic of the foregoing embodiment. The potential deviation preventing transistors $Tr_{CN}$ are, for example, enhancement type N channel MOS transistors.

The gates of said transistors $Tr_{CN}$ are supplied, as shown in FIG. 1 (b) with a potential $V_{CN}$ (=$V_{SS}+\Delta V_{CN}$, N=1 to n) to prevent the deviation $\Delta V$ of the potential of the data lines $DL_N$ from the referential power source potential $V_{SS}$ toward the negative side. The $\Delta V_{CN}$ denotes the threshold voltage $Vth_{CN}$ (N=1 to n) of, for example, the potential deviation-preventing transistor $Tr_{CN}$. When this transistor $Tr_{CN}$ is rendered conductive, the data lines $DL_N$ have a potential ($V_{CN}$-$Vth_{CN}$). According to the foregoing embodiment, the drain of the potential deviation-preventing transistor $Tr_{CN}$ is supplied with the positive power source potential $V_{DD}$. However, the potential supplied to the transistor $Tr_{CN}$ need not be limited to $V_{DD}$, but VDD well serves the purpose, provided the DD potential is higher than the aforesaid potential $V_{CN}$.

The other side ends of the data lines $DL_N$ are connected to the corresponding amplifiers 50 (sense amplifiers or refresh circuits). Each amplifier 50 is used as a sense amplifier for detecting the potential changes of the data line $DL_N$ and amplifying the potential to the referential power source potential $V_{SS}$ or positive power source potential $V_{DD}$, or as a refresh circuit for refreshing data stored in a memory cell MN. The amplifier 50 is formed of a circuit denoted by referential numeral 18 of FIG. 5 appended to the U.S. Pat. No. 3,765,003 or a sense amplifier shown in FIGS. 1 and 2 attached to the U.S. Pat. No. 3,774,176. Where such an amplifier shown as set forth in the specification of the U.S. Pat. No. 3,774,176 is used as the amplifier 50 of this invention, it is advised to arrange memory cells on both sides of the sense amplifier. Where the sense amplifier indicated in FIG. 1 accompanying the U.S. Pat. No. 3,774,176 is used, then the precharge transistors $Tr_{pN}$ may be formed of transistors constituting the amplifier 50.

Figure 3A:
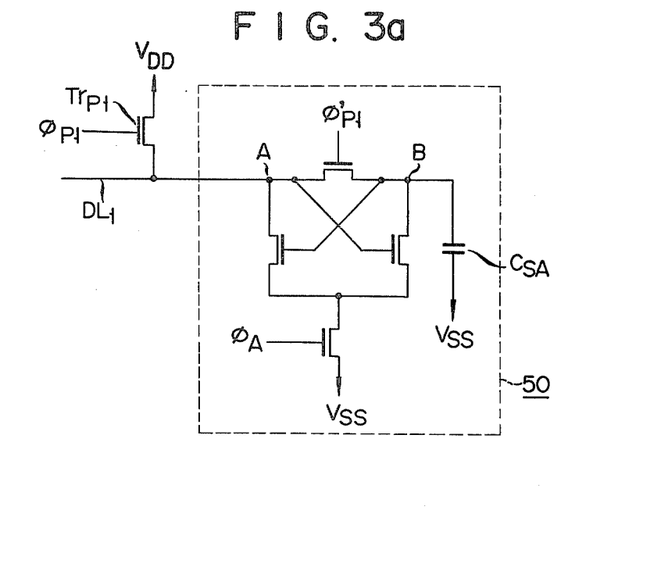

Also applicable as the above-mentioned amplifier 50 is such a sense amplifier as shown in FIG. 3 (a). The sense amplifier in FIG. 3 (a) is of unbalanced type, while the sense amplifier shown in FIGS. 1 and 2 of the U.S. Pat. No. 3,774,176 is of balanced type. If such unbalanced type amplifier 50 is used, the memory cells are arranged on one side of the amplifier 50 or on the side of the data line $DL_1$ shown in FIG. 3 (a). In FIG. 3 (a), the precharge transistor $Tr_{p1}$ may be deemed either to be included in the sense amplifier 50 or not to be included therein.

Figure 3B:
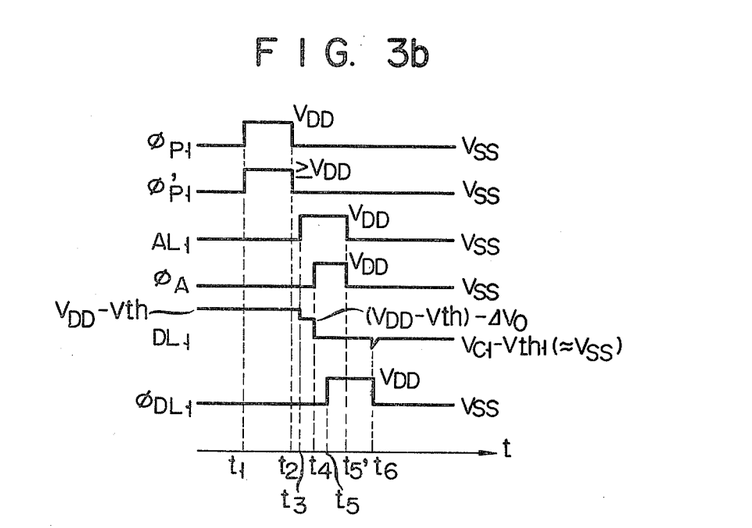

FIG. 3 (b) shows the operating waveforms of the dynamic RAM of FIG. 1 (a) which uses the sense amplifier 50 and the precharge MOS transistor $Tr_{p1}$ shown in FIG. 3 (a). It is easily understood that the waveforms shown in FIG. 3 (b) are the same as those shown in FIG. 1 (b). This means that the circuit shown in FIG. 3 (a) operates substantially in the same mode as shown in FIG. 1 (b). Thus, the operation of the circuit shown in FIG. 3 (a) is not described here in detail. To clarify how the circuit of FIG. 3 (a) operates, however, signals $\phi'_{p1}$ and $\phi_A$ shown in FIG. 3 (b) will be explained briefly.

Both nodes A and B shown in FIG. 3 (a) are charged to the same potential ($V_{DD}$−Vth) upon receipt of the signals $\phi_{p1}$ and $\phi'_{p1}$. This potential ($V_{DD}$−Vth) at the nodes A and B is maintained during the time interval $t_1-t_2$ shown in FIG. 3 (b). When, after reading of the data from the memory cells, the potential of the data line $DL_1$ is rendered lower than a predetermined potential, the sense amplifier 50 is operated upon receipt the signal $\phi_A$ during the time interval $t_4-t_5$. This is because the capacitance of a capacitor $C_{SA}$ is so predetermined that at that time the sense amplifier 50 may sense a "zero data" in the data line $DL_1$.

There will now be described by reference to FIGS. 1 (a) and 1 (b) the operation of a dynamic RAM constructed as described above.

At the time of reading

Before reading, the capacitors $C_{MN}$ of the memory cells MN are already supplied with data of "1" or "0". For convenience of description, let it be assumed that a memory cell 11 connected to a data line $DL_1$ is supplied with data of "0", and a memory cell 21 is supplied with data of "1", and that data of "0" stored in the memory cell 11 is going to be read out.

(1) Initially, a low referential power source potential $V_{SS}$ is supplied to the gates of the data line-selecting transistors $Tr_{DN}$ and the transistors $T_{MN}$ of the memory cells MN, rendering all the transistors $Tr_{DN}$ and $T_{MN}$ nonconductive.

(2) At time $t_1$: a precharge signal $\phi_{pN}$ supplied to the gates of the precharge transistors $Tr_{PN}$ has its potential increased to such a high level as $V_{DD}$ as shown by $\phi_{p1}$ of FIG. 1 (b), causing the potential of the data lines $DL_N$ to be charged to a level expressed as $V_{DD}-Vth_{pN}$ (where $Vth_{pN}$ is the threshold voltage of the precharge transistors $Tr_{pN}$).

At time $t_2$: although the precharge signal $\phi_{pN}$ has its potential decreased to such a low level as $V_{SS}$, yet the potential of the data lines maintains the aforesaid level $V_{DD}-Vth_{pN}$ due to a capacitance accompanying the data lines.

(3) At time $t_3$: the address line $AL_1$ connected to the memory cell 11 has its potential increased to such a high level as $V_{DD}$, causing a transistor $T_{11}$ to be rendered conductive. Since, at this time, data of "0" is stored in the capacitor 11, the potential of the data line $DL_1$ shows a deviation $\Delta V_0$ from the aforesaid level $V_{DD}-Vth_{pN}$ toward the negative side.

At time $t_4$: the above-mentioned minute deviation is amplified by the amplifier 50. Namely, since the data line $DL_1$ is connected to the terminal having the referential power source potential $V_{SS}$ through a switching element included in the amplifier 50 and designed to connect the data line $DL_1$ to the $V_{SS}$ terminal, the logic level of the data line $DL_1$ is charged to "0".

(4) At time $t_5$: a data line-selecting signal $\phi_{DL1}$ supplied to the gate of the data line-selecting transistor $Tr_{D1}$ has its potential increased to such a high level as $V_{DD}$, causing a signal of "0" sent forth from the data line $DL_1$ to be transferred outside of the dynamic RAM through the output circuit 35.

At time $t_6$: the data line-selecting signal $\phi_{DL1}$ again has its potential decreased to such a low level as $V_{SS}$, rendering the data line-selecting transistor $Tr_{D1}$ nonconductive. Since, at this time, a large capacitance $C_C$ (not shown) is formed between the gate of the data line-selecting transistor $Tr_{D1}$ and the data line $DL_1$, electric energy charged in the data line $DL_1$ is divided by the large capacitance $C_C$ and another capacitance $C_{DL1}$ (not shown) accompanying the data line $DL_1$. Further, ringing takes place by a combination of inductance and capacitance accompanying the data line $DL_1$. As the result, the potential of the data line $DL_1$ tends to be deviated toward the negative side rather than toward the referential power source potential $V_{SS}$. Namely, the gate potential of the transistor $T_{21}$ of the memory cell 21 supplied with data of "1" tends to turn positive relative to the source potential of the transistor $T_{21}$, which is consequently going to be rendered conductive. Since, however, the data line $DL_1$ is connected, as previously mentioned, to the potential deviation-preventing transistor $Tr_{C1}$, the potential of the data line $DL_1$ is more effectively prevented from making a deviation $\Delta V$ from the referential power source potential $V_{SS}$ toward the negative side, and in consequence data of "1" stored in the capacitor $C_{21}$ is less likely to dissipate than in the prior art dynamic RAM.

That is, the gate of the potential deviation-preventing transistor $Tr_{C1}$ is supplied with a potential $V_{C1}$, and the potential of the data line $DL_1$ is maintained at a level of $V_{C1}-Vth_{C1}$ ($\delta V_{SS}=0$) when the transistor $Tr_{C1}$ is operated. Thus, the transistor $T_{21}$ of the memory cell 21 is not made conductive. Conduction, if any, of the transistor $T_{21}$ is brought to an end in an extremely short time, thereby causing data of "1" to be less likely to dissipate because the gate potential of the transistor $T_{21}$ more decreases from the source potential thereof than when the potential deviation preventing transistor $Tr_{C1}$ is not provided.

Voltage $\Delta V_{C1}$ ($=V_{C1}-V_{SS}$) impressed on the gate of the transistor $Tr_{C1}$ theoretically serves the purpose, if it meets the undermentioned conditions (a) and (b):

(a) Where the data line $DL_1$ is to be charged to a level of "1" (for example, when the precharge transistor $Tr_{p1}$ is made conductive), then the data line $DL_1$ should be charged exactly to a level of "1" (this level need not be made equal to the positive power source potential $V_{DD}$).

(b) Where the data line $DL_1$ is to be discharged to a level of "0", then the discharge should be carried out exactly to a level of "0" without causing the potential of the data line $DL_1$ to show a deviation $\Delta V$ toward the negative side (this level of "0" need not be made equal to the referential power source potential $V_{SS}$).

Where, however, the voltage $\Delta V_{C1}$ is unduly high or low, the following problemes are raised. Therefore, the voltage $\Delta V_{C1}$ is preferred to have a value approaching the threshold voltage $Vth_{C1}$ of the potential deviation-preventing transistor $Tr_{C1}$.

(1) Where the voltage $\Delta V_{C1}$ is unduly high, then the level "0" of the data line $DL_1$ (corresponding to the potential $V_{C1} - Vth_{C1}$) rises above the referential power source potential $V_{SS}$ with the resultant decline in voltage margin. Therefore, the data line $DL_1$ can not be operated over a broad range of voltage, presenting difficulties in designing a dynamic random access memory. Further where the amplifier 50, for example, is operated, the data line $DL_1$ is connected to a terminal having the referential power source potential $V_{SS}$ through the amplifier 50. As a result, a direct current route is formed through the potential deviation-preventing transistor $Tr_{C1}$ between the terminals having the positive power source potential $V_{DD}$ and referential power source potential $V_{SS}$ respectively, leading to an increase in power consumption.

(2) Where the voltage $\Delta V_{C1}$ is too low, the potential deviation-preventing transistor $Tr_{C1}$ is not operated before the deviation of the potential of the data line $DL_1$ toward the negative side increases over a certain value. Therefore, it is impossible fully to suppress the dissipation of stored data of "1" caused by the deviation $\Delta V$.

It is apparent from the above-mentioned facts that the voltage $\Delta V_{C1}$ is preferred to have such a value that where the data line $DL_1$ has a higher potential than the referential power source potential $V_{SS}$, then the potential deviation-preventing transistor $Tr_{C1}$ is rendered nonconductive; and where the potential of the data line $DL_1$ is deviated to any extent from the referential power source potential $V_{SS}$ toward the negative side, then the transistor $Tr_{C1}$ is rendered conductive, namely, a level equal to the threshold voltage $Vth_{C1}$ of the transistor $Tr_{C1}$.

Where the voltage $\Delta V_{C1}$ has a value equal or close to the threshold voltage $Vth_{C1}$ (this value is hereinafter referred to as "the substantial threshold voltage of the transistor $Tr_{C1}$"), then the transistor $Tr_{C1}$ is rendered conductive when the potential of the data line $DL_1$ is going to be deviated from the referential power source potential $V_{SS}$ toward the negative side. As a result, the data line $DL_1$ is charged to a potential of $V_{C1} - Vth_{C1}$ ($\delta V_{SS} = 0$), thereby preventing the transistor $T_{21}$ from becoming conductive. Even when the data line $DL_1$ is connected to a terminal having the referential power source potential $V_{SS}$ through, for example, the amplifier 50 during its operation, little current passes through the transistor $Tr_{C1}$, which remains substantially nonconductive, thereby considerably decreasing power consumption without any decline in the voltage margin of the data line $DL_1$.

Figure 1C:
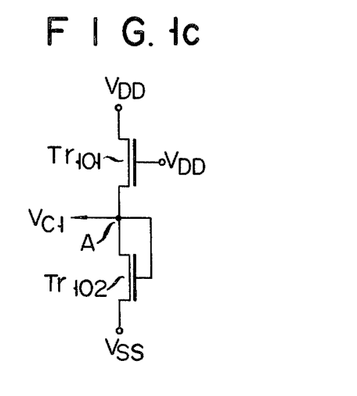

There will now be described by reference to FIG. 1 (c) a circuit for generating a voltage $\Delta V_{C1}$ which is to be impressed on the gate of the potential deviation-preventing transistor $Tr_{C1}$. First and second transistors $Tr_{101}$, $Tr_{102}$ are connected in series between the terminals which have positive power source potential $V_{DD}$ and referential power source potential $V_{SS}$, respectively. The first and second transistors $Tr_{101}$, $Tr_{102}$ are, for example, enhancement type N channel MOS transistors. The gate of the first transistor $Tr_{101}$ is supplied with the positive power source potential $V_{DD}$. The gate of the second transistor $Tr_{102}$ is connected to the junction A of both transistors $Tr_{101}$, $Tr_{102}$. The conductance $gm_{102}$ of the second transistor $Tr_{102}$ is chosen to be for extremely larger than the conductance $gm_{101}$ of the first transistor $Tr_{101}$. As above mentioned, an output voltage of the circuit for generating voltage $\Delta V_{CN}$ can be made substantially equal to the threshold voltage $Vth_{CN}$. The threshold voltage $Vth_{102}$ of the second transistor $Tr_{102}$ is chosen to be equal to the desired erroneous potential deviation-preventing voltage $\Delta V_{C1}$.

Since MOS transistors formed in a single chip generally have substantially the same threshold voltage, it is unnecessary to take any special care in order to set the threshold voltage of the MOS transistors, for example, the threshold voltage $Vth_{102}$ of the transistor $Tr_{102}$, individually at a value $\Delta V_{CN}$ (e.g. $\Delta V_{C1}$) when it is desired to use the threshold voltage $Vth_{CN}$ (e.g. $Vth_{C1}$) as the voltage $\Delta V_{CN}$ (e.g. $\Delta V_{C1}$).

Where, with the potential deviation-preventing voltage generator arranged as described above, the gate voltage of the second transistor $Tr_{102}$ falls below the threshold voltage $Vth_{102}$ thereof, then the transistor $Tr_{102}$ is cut off, causing voltage at the aforesaid junction A to be substantially equal to the threshold voltage $Vth_{102}$ of the transistor $Tr_{102}$. It is therefore advised to use the potential at the junction A as the potential deviation-preventing potential $V_{C1}$.

As mentioned above, transistors formed in a single chip generally come to have substantially the same threshold voltage. Thus, potentials $V_{C1}$ to $V_{CN}$ are substantially identical, and only one circuit is required to provide the substantially identical potential $V_C$.

As mentioned above, potential $V_{DD}$ is applied to the first terminal (drain) and gate terminal of the first transistor $Tr_{101}$. It is sufficient, however, if the first and gate terminals of the first transistor $Tr_{101}$ are applied with a potential higher than the potential to be applied to the third terminal (source) of the first transistor $Tr_{101}$. For this reason, the first and gate terminals of the transistor $Tr_{101}$ may be connected to a circuit of a higher potential than that of the third terminal, not to potential $V_{DD}$. Of course, the first and gate terminals need not be connected to the same potential.

There will now be described the write operation of the dynamic RAM arranged as mentioned above.

At the time of writing

In this case, the input circuit 30 is used in place of the output circuit 35. Writing operation is similar to reading operation, and its fundamental process is generally known. Therefore, writing operation is not described here in detail.

Where data of "0" is written in a memory cell 11, the data line $DL_1$, precharged to a level corresponding to data of "1" by the precharge transistor $Tr_{p1}$, is discharged to a level of "0" required to write data through the input circuit 30 and data line-selecting transistor $Tr_{D1}$. Data in the data line $Dl_1$ discharged to a level of "0" is stored in a capacitor $C_{11}$ through a transistor $T_{11}$.

At the time of writing, too, the potential of the data line $DL_1$ is sometimes deviated from the referential power source potential $V_{SS}$ toward the negative side as described in connection with reading. Since, however, the potential deviation-preventing transistor $Tr_{C1}$ is provided, it is possible to suppress the erroneous behavior of a dynamic RAM resulting from dissipation of data of "1" stored in a nonselected memory cell.

As mentioned above, a typical embodiment of this invention provides a dynamic read-write random access memory, in which the potential deviation-preventing transistors $Tr_{CN}$ are connected to the corresponding data lines $DL_N$; and the gate of the transistors $Tr_{CN}$ is supplied with potential deviation-preventing voltage $V_{CN}$, thereby saving the random access memory from an erroneous behavior caused by the deviation $\Delta V$ of the potential of the data lines $DL_N$ from the referential power source potential $V_{SS}$ toward the negative side.

There will now be described by reference to FIGS. 2(a), 2(b) and 2(c) a dynamic read-write random access memory according to another embodiment of this invention.

Figure 2A:
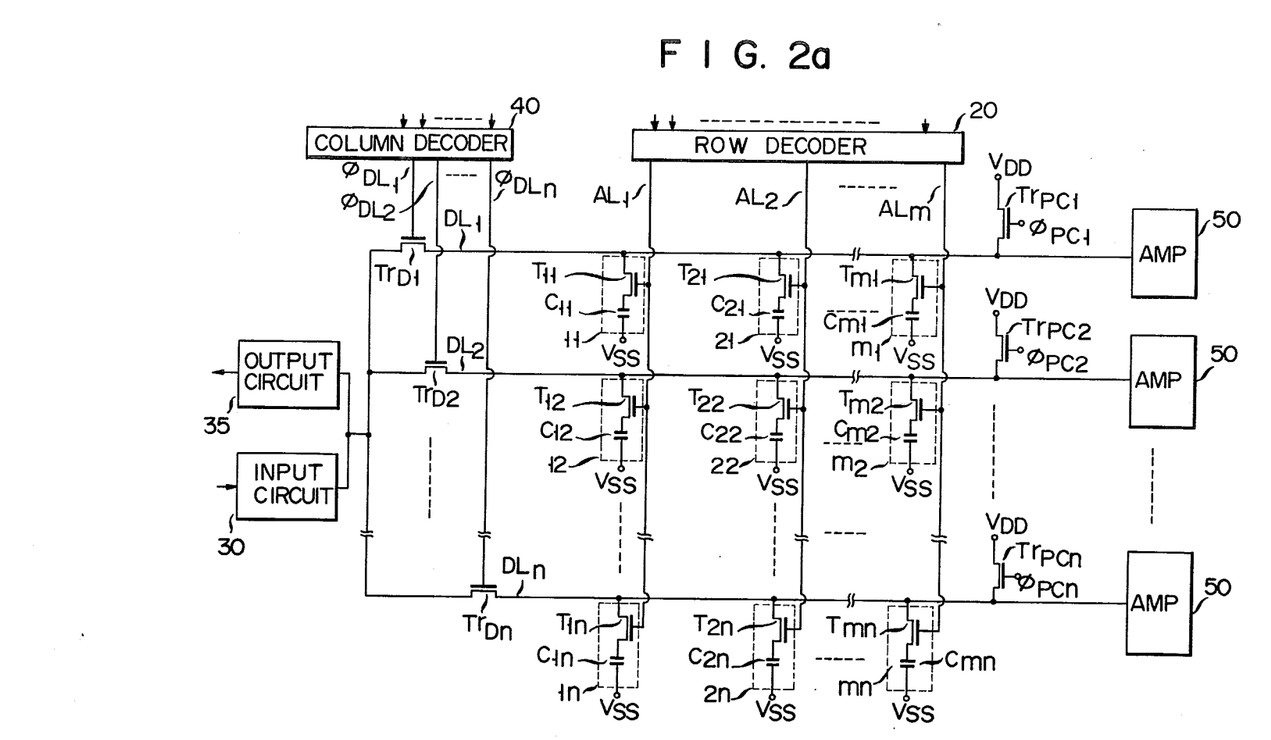

As apparent from FIG. 2(a), a difference between the preceding and succeeding embodiments is that the precharge transistors $Tr_{pN}$ and potential deviation-preventing transistors $Tr_{CN}$ used in the preceding embodiment are replaced by transistors $Tr_{pCN}$ (N=1 to n) designed for precharge as well as for prevention of an erroneous behavior.

The embodiment of FIG. 2 has substantially the same arrangement as the preceding one in other respects. The parts of the latter embodiment the same as those of the preceding one are denoted by the same numerals, description thereof being omitted. The transistor $Tr_{pCN}$ designed concurrently for precharge and prevention of an erroneous behavior which most prominently characterizes the latter embodiment of FIG. 2(a) is connected between the data lines $DL_N$ and terminals having the positive power source potential $V_{DD}$. The concurrently acting transistor $Tr_{pCN}$ may be used as one of the transistors constituting the amplifier 50. The transistor $Tr_{pCN}$ is chosen to be, for example, an enhancement type N channel MOS transistor.

The gate of the transistor $Tr_{pCN}$ is supplied with a signal $\phi_{pCN}$ (N=1 to n) designed concurrently for precharge and prevention of an erroneous behavior. The potential of the concurrently acting signal $\phi_{pCN}$ has such a high level as $V_{DD}$ (or a level close thereto), as shown by $\phi_{pC1}$ of FIG. 2(b), and such a low level as $VV_{SS}+\Delta V_{pCN}$ (N=1 to n). Here, "$\Delta V_{pCN}$" may be, for example, the threshold voltage $Vth_{pCN}$ (N=1 to n) of the concurrently acting transistor $Tr_{pCN}$.

There will now be described by reference to FIGS. 2(a) and 2(b) the operation of the dynamic RAM of the second embodiment arranged as mentioned above.

At the time of reading

Before reading, the capacitors $C_{MN}$ of the memory cells MN are already supplied with data of "1" or "0". For convenience of description, let it be assumed that the memory cell 11 connected to the data line $DL_1$ is supplied with data of "0"; the memory cell 21 is supplied with data of "1"; and data of "0" stored in the memory cell 11 is going to be read out.

(1) Initially, the gates of the data line-selecting transistor $Tr_{DN}$ and other transistors $T_{MN}$ are supplied with a low referential power source potential $V_{SS}$, thus rendering these transistors $Tr_{DN}$ nonconductive.

Figure 2B:
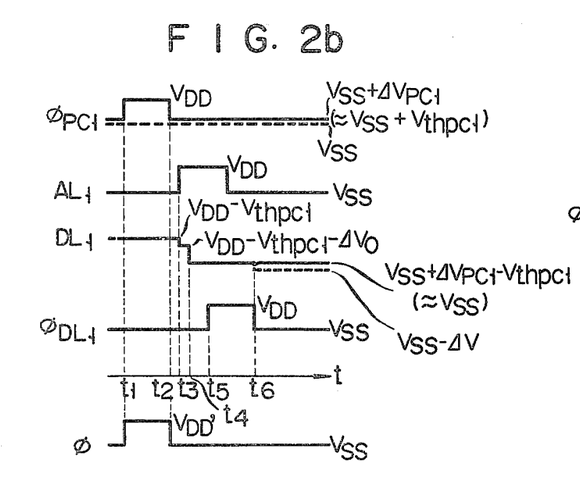
Figure 2C:
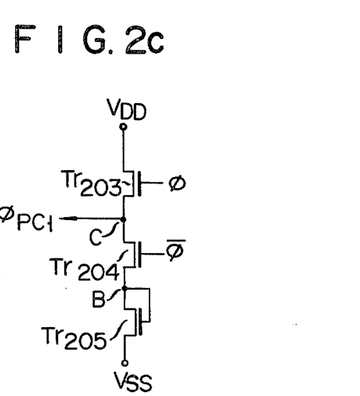

(2) At time $t_1$: the potential of the signal $\phi_{pCN}$ supplied to the gates of the transistors $Tr_{pCN}$ designed concurrently for precharge and prevention of an erroneous behavior is increased to such a high level as $V_{DD}$ indicated by $\phi_{pC1}$ of FIG. 2(b), causing the data lines $DL_N$ to be precharged to a level of $V_{DD}$-$Vth_{pCN}$.

At time $t_2$: the potential of the signal $\phi_{pCN}$ falls to a level of $V_{SS}+\Delta V_{pCN}$.

(3) At time $t_3$: the potential of an address line $AL_1$ connected to the memory cell 11 is increased to such a high level as $V_{DD}$, rendering the transistor $T_{11}$ conductive. Since the capacitor 11 is supplied with data of "0", the potential of the data line $DL_1$ indicates a deviation $\Delta V_0$ toward the negative side.

At time $t_4$: the above-mentioned minute voltage change $\Delta V_0$ is amplified by the amplifier 50, causing the level of the data line $DL_1$ to be changed to "0" by the switching operation of the amplifier 50.

(4) At time $t_5$: the gate potential $\phi_{DL1}$ of the data line-selecting transistor $Tr_{D1}$ is increased to such a high level as $V_{DD}$, causing data corresponding to the level "0" of the data line $DL_1$ to be transmitted outside of the dynamic RAM through the output circuit 35.

At time $t_6$: the gate potential $\phi_{DL1}$ again falls to such a low level as $V_{SS}$, rendering the transistor $Tr_{D1}$ nonconductive.

At this time, the potential of the data line $DL_1$ tends to be deviated, as in the preceding embodiment, from the referential power source potential $V_{SS}$ toward the negative side. Therefore, the transistor $T_{21}$ of the memory cell 21 supplied with data of "1" is going to be made conductive. Since, however, the data line $DL_1$ is connected to the transistor $Tr_{pCN}$ designed concurrently for precharge and prevention of an erroneous behavior, the potential of the data line $DL_1$ is less likely to present a noticeable deviation $\Delta V$ from the referential power source potential $V_{SS}$ toward the negative side, and loss of data of "1" stored in the capacitor $C_{21}$ is more effectively decreased than in the prior art dynamic RAM. In the other words, at this time the gate of the concurrently acting transistor $Tr_{pC1}$ is supplied with a potential $V_{SS}+\Delta V_{pC1}$, and the potential of the data line $DL_1$ is maintained at a level of $V_{SS}+\Delta V_{pC1}-Vth_{pC1}$ ($\simeq V_{SS}=0$) when the concurrently acting transistor $Tr_{pC1}$ is rendered conducting. Therefore, the transistor $T_{21}$ is prevented from being rendered conductive. Conduction, if any, of the transistor $T_{21}$ is brought to an end in an extremely short time, because the gate potential of the transistor $T_{21}$ more falls from the source potential thereof than when the concurrently acting transistor $Tr_{pCN}$ is not provided. Accordingly, loss of data of "1" is more decreased.

The low level $V_{SS}+\Delta V_{pC1}$ of the signal $\phi_{pC1}$ designed concurrently for charge and prevention of an erroneous behavoir well serves the purpose, provided the low level enables (a) the data line $DL_1$ to be charged exactly to a level of "1" or "0" and (b) prevents the potential of the data line $DL_1$ from indicating a deviation $\Delta V$ toward the negative side, as described in connection with the potential deviation-preventing voltage $V_{CN}$ used in the first embodiment.

As is apparent from the description of the embodiment, the above-mentioned low potential $V_{SS}+\Delta V_{pC1}$ is most preferred to be $V_{SS}+\Delta Vth_{pC1}$ in consideration of the voltage margin and the power consumption.

There will now be described by reference to FIG. 2(c) a circuit for generating a signal $\phi_{pC1}$ designed concurrently for charge and prevention of an erroneous behavior. Connected in series between the terminals having a positive power source potential $V_{DD}$ and a referential power source potential $V_{SS}$ respectively, there are connected in series third, fourth and fifth transistors $Tr_{203}$, $Tr_{204}$, $Tr_{205}$ in this order. These transistors are, for example, enhancement type N channel MOS transistors. The gate of the third transistor $Tr_{203}$ is supplied with the later described timing signal $\phi$. The gate of the fourth transistor $Tr_{204}$ is supplied with a signal $\bar{\phi}$ whose phase is inverted from that of the aforesaid timing signal $\phi$. The gate of the fifth transistor $Tr_{205}$ is connected to the junction B of the fourth and fifth transistors $Tr_{204}$, $Tr_{205}$.

The timing signal $\phi$ is designed to act, as shown in FIG. 2(b), as a signal denoting a potential $V_{DD'}$ (generally higher than $V_{DD}$) and a potential $V_{SS}$ in response to the aforesaid signal $\phi_{pC1}$ designed concurrently for precharge and prevention of an erroneous behavior. The threshold voltage $Vth_{205}$ of the fifth transistor $Tr_{205}$ is set at a voltage substantially equal to the $\Delta V_{pC1}$.

With the circuit arranged as described above for generation of a signal designed concurrently for precharge and prevention of an erroneous behavior, a potential at a junction C of the third and fourth transistors $Tr_{203}$, $Tr_{204}$ changes as follows.

(1) Where the timing signal $\phi$ has such a high potential as $V_{DD'}$, then the third transistor $Tr_{203}$ is rendered conductive, and the fourth transistor $Tr_{204}$ is rendered nonconductive. Therefore, the potential at the junction C is charged to a high level ($\simeq V_{DD}$).

(2) Where the timing signal $\phi$ has such a low potential as $V_{SS}$, then the third transistor $Tr_{203}$ is rendered nonconductive, and the fourth transistor $Tr_{204}$ becomes conductive. Where voltage at the junction B falls below the threshold voltage $Vth_{205}$ of the fifth transistor $Tr_{205}$, then this transistor $Tr_{205}$ is cut off, rendering the potential at the junction C substantially equal to the above-mentioned low potential $V_{SS} + \Delta V_{pC1}$. Therefore, it is advised to use the potential change at the junction C as the concurrently acting signal $\phi_{pC1}$.

As mentioned above, transistors formed in a single chip generally come to have substantially the same threshold voltage. Thus, instead of signals $\phi_{pC1}$ to $\phi pCN$, only one signal $\phi_{pC}$ is necessary, and only one circuit is required to provide the signal $\phi_{pC}$.

There will now be described the writing of data in the dynamic RAM according to the second embodiment of FIGS. 2(a), 2(b) and 2(c).

At the time of writing

In this case, the input circuit 30 is used in place of the output circuit 35 applied in the reading of data. Writing is effected through substantially the same process as in the case of reading, detailed description thereof being omitted. Where data of "0" is written in, for example, a memory cell 11, the data line $DL_1$ precharged to a level "1" by the transistor $Tr_{pC1}$ is designed concurrently for precharge and prevention of an erroneous behavior is discharged to a level of "0" required for writing through the input circuit 30 and data line-selecting transistor $Tr_{D1}$. Data of "0" in the discharged data line $DL_1$ is stored in a memory cell 11 through a transistor $T_{11}$.

At the time of writing, too, the potential of the data line $DL_1$ is sometimes deviated from the referential power source potential $V_{SS}$ toward the negative side as in the case of reading. Since, however, the data line $DL_1$ is provided with the corresponding transistor $Tr_{pC1}$ designed concurrently for precharge and prevention of an erroneous behavior, the dynamic RAM is saved from an erroneous behavior caused by dissipation of data of "1" stored in a nonselected memory cell.

The embodiment of FIG. 2(a) provides a stable dynamic read-write random access memory, in which the data lines $DL_N$ are connected to the corresponding transistors $Tr_{pCN}$ designed concurrently for precharge and prevention of an erroneous behavior; and the gates of the concurrently acting transistors $Tr_{pCN}$ are supplied with a signal $\phi_{pCN}$ designed concurrently for precharge and prevention of an erroneous behavior, thereby suppressing the deviation $\Delta V$ of the potential of the data lines $DL_N$ from the referential power source potential $V_{SS}$ toward the negative side.

As clearly mentioned above, this invention provide a dynamic read-write random access memory which operates under a stable condition.

As used herein, the term "referential potential" or "referential power source potential" is defined to mean a power source potential $V_{SS}$ (generally zero potential) supplied to the source side of an operating MOS transistor. The "referential potential" has the following relationship with another potential when an N channel MOS transistor is used:

Referential potential < another potential and where a P channel MOS transistor is applied, the relationship results as follows:

Referential potential > another potential.

The term "substantial threshold voltage" is defined to mean a threshold voltage or a level close thereto. Where the threshold voltage is 1 volt, then the substantial threshold voltage represents a range up to 1.5 volts.

Obviously, many modifications and variations of this invention are possible in the light of the above teachings. Though the above-mentioned embodiments use an N channel MOS transistor, yet it is possible to use a P channel MOS transistor by reversing the polarity of a positive power source potential $V_{DD}$ and a signal $\phi_{pN}$.

The foregoing description refers to the case where the memory cell is of the one transistor/cell type. However, this invention is also applicable to the case where the memory cell is of the three transistors/cell type or four transistors/cell type by providing the respective data lines with, for example, an potential deviation-preventing transistor. After all, this invention can be applied to a memory for dynamically storing data. Further, it will be noted that where, with the foregoing embodiments, the threshold voltage $Vth_{MN}$ (M=1 to m; N=1 to n) of the transistors $T_{MN}$ of the memory cells MN is chosen to have a large value, then this invention provides a more stable dynamic RAM.

All the embodiments mentioned above are dynamic read-write RAMs of precharge type. This invention is not limited to a dynamic read-write RAM of precharge type and can be applied to a dynamic read-write RAM of the type wherein the data lines are charged during a specific time interval from the time (e.g. $t_4$ in FIG. 1(B)) when the sense amplifier begins to operate. If this invention is applied to a dynamic read-write RAM of this type, such a sense amplifier as shown, for example, in the U.S. Pat. No. 3,774,176 will be used.

The above-mentioned potential deviation-preventing transistors need not be limited to enhancement type. Transistors of depletion type of bi-polar type can be used as potential deviation-preventing transistors in this invention.

In the above-mentioned embodiments of this invention the sense amplifier 50 is of either balanced type or unbalanced type. In practice, however, a sense amplifier of balanced type is preferred.

It is therefore to be understood that within the scope of the appended claims, this invention may be practiced otherwise than specifically described.

What is claimed is:

1. A dynamic read-write random access memory which comprises (a) a plurality of data lines; (b) a plurality of memory cells with each cell selectably connected to one of said data lines to drive said one of said data lines toward one of first and second reference potentials depending upon the stored content of said cell; and (c) potential deviation preventing means connected to said data lines for preventing the potential of said data lines from being deviated from said first reference potential in an opposite direction to that of said second reference potential to minimize loss of said stored content of any of said cells which are not being accessed.

2. A dynamic read-write random access memory which comprises (a) a plurality of data lines; (b) a plurality of memory cells with each cell selectably connected to one of said corresponding data lines to drive said one of said data lines toward one of first and second reference potentials depending upon the stored content of said cell; and (c) an MOS transistor connected between each of said data lines and terminals having said second reference potential; and (d) means for supplying the gates of said transistors with a potential deviation preventing voltage sufficient to prevent the potential of said data lines from being deviated from said first reference potential in an opposite direction to that of said second reference potential to minimize loss of said content of any of said cells which are not being accessed.

3. The dynamic random access memory according to claim 2, wherein said MOS transistors are of the enhancement type; and said potential deviation preventing voltage is the sub-stantial threshold voltage of said MOS transistors.

4. A dynamic read-write random access memory which comprises (a) a plurality of data lines; (b) a plurality of memory cells with each cell selectably connected to one of said corresponding data lines to drive said one of said data lines toward one of first and second reference potentials depending upon the stored content of said cell; (c) potential deviation preventing enhancement-type MOS transistors connected between said data lines and power terminals having said second reference potential; (d) first and second enhancement-type MOS transistors having source and drains series coupled between said second and first reference potentials, the gate of said first transistor being coupled to said second reference potential and both the gate of said second transistor and the common source-drain junction of said first and second transistors being coupled to the gate of a corresponding one of said potential deviation preventing MOS transistors.

5. The dynamic random access memory according to claim 4, which further comprises charge transistors connected to said corresponding data lines for precharging said data lines to a selected potential.

6. The dynamic random access memory according to claim 4, which further comprises sense amplifiers connected to said corresponding data lines, each sense amplifier including a corresponding one of said charge transistors.

7. The dynamic random access memory according to claim 4, wherein said memory cells each consists of one MOS tran-sistor and one capacitor.

8. The dynamic random access memory according to claim 4, wherein said second enhancement type MOS transistor has a larger conductance than said first enhancement type MOS transistor.

9. A dynamic read-write random access memory which comprises (a) a plurality of data lines; (b) a plurality of memory cells with each cell selectably connected to one of said corresponding data lines to drive said one of said data lines toward one of first and second reference potentials depending upon the stored content of said cell; (c) enhancement-type MOS transistors connected between said data lines and a terminal having said first re-ference potential; and (d) electric circuits connected to the gates of said MOS transistors to supply said gates with a signal having first and second potentials with said first potential rendering said MOS transistors conducting for charging of said data lines and said second potential rendering said MOS tran-sistors substantially nonconducting to prevent the potential of said data lines from being deviated from said first reference potential in an opposite direction to that of said second reference potential to minimize loss of said stored content of any of said cells which are not being accessed.

10. A dynamic read-write random access memory which comprises (a) a plurality of data lines; (b) a plurality of memory cells with each cell selectably connected to a corresponding one of said data lines to drive said one of said data lines toward one of first and second reference potentials denpending upon the stored content of said cell; (c) first enhancement-type MOS transistors connected between said data lines and a terminal having said second reference potential; (d) second enhancement-type MOS transistors each having a first terminal connected to said terminal having said second reference source potential, a second terminal connected to a gate terminal of said first enhancement-type MOS transistor and a gate terminal supplied with a timing signal; (e) third enhancement-type MOS transistors each having a first terminal connected to said second terminal of said second enhancement-type MOS transistor, and a gate terminal supplied with a signal produced by reversing the phase of said timing signal; and (f) fourth enhancement-type MOS transistors each having first and gate terminals connected to a second terminal of a corresponding third enhancement-type MOS transistor and having second terminals connected to a terminal having said first reference potential.

11. The dynamic random access memory according to claim 10, wherein said memory cells each consist of one MOS transistor and one capacitor.

12. The dynamic random access memory according to claim 10, which further comprises sense amplifiers connected to said data lines, each sense amplifier including one of said first enhancement-type MOS transistors for both precharging said data lines and for preventing the potential of said data lines from being deviated from said first reference potential in an opposite direction to that of said second reference potential.

13. A dynamic read-write random access memory which com-prises (a) a plurality of data lines; (b) a plurality of memory cells with each cell selectably connected to one of said data lines to drive said one of said data lines toward one of first and second reference potentials depending upon the stored content of said cell; (c) potential deviation preventing transistors have source and drains connected between said data lines and terminals having said second reference potential; (d) first enhancement-type MOS transistors each having a first terminal connected to a terminal having said second reference potential, a gate terminal connected to a terminal having said second reference potential, and a third terminal connected to the gate terminal of a corresponding potential deviation preventing transistor, said third terminal having a potential lower in absolute value than said first and second reference potentials; and (e) second enhancement-type MOS transistors each having a first terminal and a gate terminal connected to said third terminal of a corresponding one of said first enhancement type MOS transistors and each having a third terminal connected to a terminal having said first reference potential.

* * * * *